United States Patent [19]
Yoshinouchi et al.

[11] Patent Number: 5,393,986
[45] Date of Patent: Feb. 28, 1995

[54] ION IMPLANTATION APPARATUS

[75] Inventors: Atsushi Yoshinouchi, Kashiba; Tatsuo Morita, Kyoto; Shuhei Tsuchimoto, Nara, all of Japan

[73] Assignee: Sharp Kabushiki Kaisha, Osaka, Japan

[21] Appl. No.: 942,663

[22] Filed: Sep. 9, 1992

[30] Foreign Application Priority Data

Sep. 9, 1991 [JP] Japan ................. 3-227971

[51] Int. Cl.⁶ .......................................... H01J 37/317
[52] U.S. Cl. ............................. 250/492.21; 350/397
[58] Field of Search ................ 250/492.21, 397, 398

[56] References Cited

U.S. PATENT DOCUMENTS

| | | | |
|---|---|---|---|
| 2,956,169 | 10/1960 | King et al. | 250/492.21 |
| 4,574,179 | 3/1986 | Masuzawa et al. | 250/492.21 |

FOREIGN PATENT DOCUMENTS

| | | |
|---|---|---|
| 0403418A | 12/1990 | European Pat. Off. . |
| 63-80534 | 4/1988 | Japan . |
| 63-194326 | 8/1988 | Japan . |

OTHER PUBLICATIONS

Matsuda, K., et al., "Large Diameter Ion Beam Implantation System", *Nuclear Instruments & Methods in Physics Research/Section B* (1987) vol. B21, pp. 314–316.

Rhee, M. J., "Compact Thomson Spectrometer", *Rev. Sci. Instrum.* (1984) 55(8):1229–1234.

Yamamoto, T., et al., "Thomson Parabola Ion Analyzer with Quick Data Acqusition", *Japanese Journal of Applied Physics* (1990) 29(9):1841–1845.

Thompson, B. E., et al., "Ion Bombardment Energy Distributions in Radio–Frequency Glow–Discharge Systems", *Journal of Applied Physics* (1986) 59(6):1890–1903.

*Primary Examiner*—Bruce C. Anderson
*Attorney, Agent, or Firm*—Morrison & Foerster

[57] ABSTRACT

An ion implantation apparatus having a plasma source for generating ions, an ion accelerator for accelerating the generated ions, and a substrate holder provided on a position which the accelerated ions irradiate, wherein a current density of a desired kind of ions is measured by an electromagnetic ion energy analyzer having an electric field and a magnetic field, thereby controlling a dose of the ions.

5 Claims, 2 Drawing Sheets

ION IMPLANTATION APPARATUS

BACKGROUND OF THE INVENTION

1. Field of the Invention

The present invention relates to an ion implantation apparatus, and more particularly to an ion implantation apparatus used for fabricating semiconductor devices such as a thin film transistor.

2. Description of the Prior Art

Among the processes for fabricating various semiconductor devices, ion implantation is indispensable and extremely important as a process for doping a semiconductor with impurities. A substrate on which semiconductor devices are formed has become large today since an image sensor, a liquid crystal display and the like have become large-sized and the productivity thereof has improved. As a result, an ion implantation apparatus for implanting ions on a large area is desired.

An ordinary ion implantation apparatus comprises an ion source, a mass spectrometer and an ion accelerator. Ions generated at the ion source are allowed to pass through the mass spectrometer to eliminate ions unnecessary to the ion implantation, and only the selected ions are accelerated by the ion accelerator. The accelerated ions are generally implanted into a substrate in a shape of an ion beam having a diameter of several mm. A dose of the ion implanted into the substrate can be determined by measuring an ion current flowing through the substrate.

When the ions are implanted into a large area substrate using the above described ion implantation apparatus, it is necessary to either scan the substrate mechanically or scan the ion beam electrically because the area of the substrate is large as compared with the diameter of the ion beam. This results in a problem that a larger substrate requires a longer time for the ion implantation. Moreover, providing a mechanical or an electrical scanning means causes another problem that the ion implantation apparatus becomes complicated, large-sized and expensive.

One of the techniques in which ions are easily implanted into a large substrate without the above-mentioned mechanical or electrical scanning means is disclosed in the Japanese Laid Open Patent Publication No. 63-194326. According to this prior art, ions generated by using a plasma discharge as the ion source are accelerated at a low voltage without allowing them to pass through the mass spectrometer and implanted into a substrate which has been heated to a predetermined temperature in a shower-like shape. Since the generated ions do not pass through the mass spectrometer, all kinds of generated ions including unnecessary ones are implanted. Furthermore, the dose of all the kinds of the ions is measured as the ion current. Therefore, in the prior art, the precise dose of a desired kind of ions can not be measured.

For example, in the ion implantation with the above ion implantation apparatus using $PH_3$ gas diluted with $H_2$, $P^+$ and $H^+$ are generated. Since only $P^+$ makes the substrate conductive, the dose of $P^+$ must be controlled. However, with this ion implantation apparatus, only the total dose of all the kinds of the ions including $P^+$ and $H^+$ can be measured. The dose of the desired kind of ions can only be experientially estimated based on the total dose. In such a case the control of the dose of a desired kind of ions is very inaccurate.

SUMMARY OF THE INVENTION

The ion implantation apparatus of the present invention comprises a plasma source for generating ions, an ion accelerator for accelerating the ions, a substrate holder provided on a position which the accelerated ions irradiate and an analyzing means including a field generating means for generating an electric field and a magnetic field having components vertical to an ion incident direction and a measuring means for measuring a number of the ions having passed through the electric field and the magnetic field.

In another aspect of the present invention, the ion implantation apparatus comprises a plasma source for generating ions, an ion accelerator for accelerating the ions, a substrate holder provided on a position which the accelerated ions irradiate, an electromagnetic ion energy analyzer and a charge collector for measuring a number of the ions the amount of which is practically equal to that of the ions irradiating the electromagnetic ion energy analyzer per unit time. The electromagnetic ion energy analyzer includes a field generating means for generating an electric field and a magnetic field having components vertical to an ion incident direction and a measuring means for measuring a number of a desired kind of the ions, and the measuring means has a detection area including different points at which the ions having passed through the electric field and the magnetic field arrive depending upon a mass and a charge of the ions.

As described above, in the ion implantation apparatus of the present invention, the irradiation time of a desired kind of ions is determined by the means for measuring the number of the desired kind of ions, thereby controlling doping a substrate with the impurities. Therefore, it is possible to dope the substrate with impurities uniformly to fabricate a semiconductor device with uniform characteristics. This results in increasing the yield in fabricating the semiconductor devices.

Thus, the invention described herein makes possible the advantage of providing an ion implantation apparatus for fabricating a semiconductor device with uniform characteristics by controlling the number of ions necessary to an ion implantation into a large substrate.

These and other advantages of the present invention will become apparent to those skilled in the art upon reading and understanding the following detailed description with reference to the accompanying figures.

DESCRIPTION OF THE PREFERRED EMBODIMENTS

Figure 1:
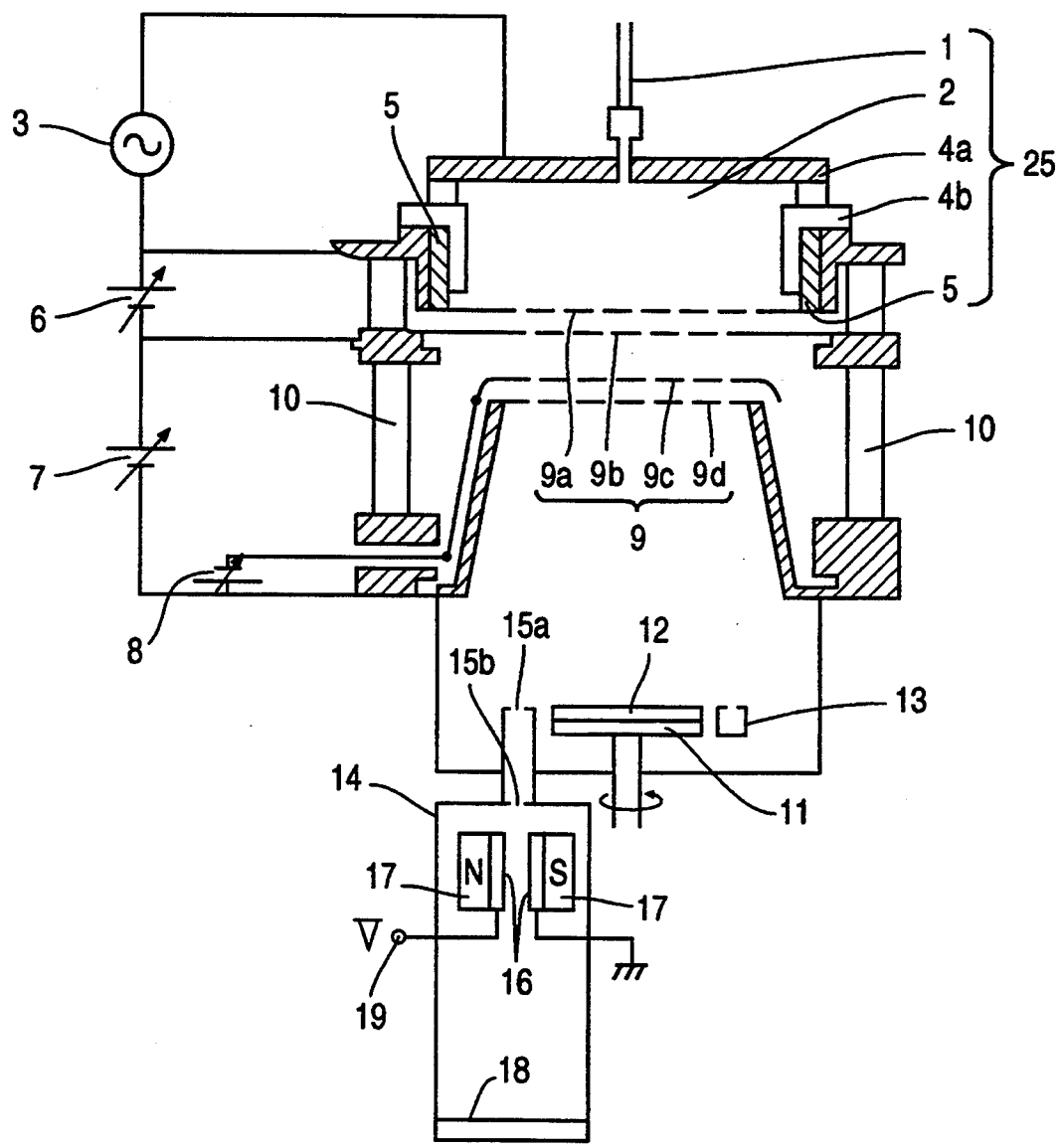
FIG. 1 is a sectional schematic view of an ion implantation apparatus according to the present invention.

FIG. 1 is a sectional schematic view of an ion implantation apparatus of the present invention. The ion implantation apparatus shown in FIG. 1 comprises a plasma source 25 for generating ions, an ion accelerator 9 for accelerating the generated ions, a substrate holder 11 for holding a substrate, an electromagnetic ion energy analyzer 14 for measuring a number of a desired kind of ions and a charge collector 13 for measuring a current density of all the kinds of the ions.

The plasma source 25 includes a cylindrical chamber 2 for keeping a plasma and high frequency electrodes 4a and 4b respectively provided on a top and a side of the cylindrical chamber 2. The high frequency electrode 4a on the top of the cylindrical chamber 2 has a diameter of 60 cm. A high frequency power supply 3 for exciting a plasma is connected to the high frequency electrodes 4a and 4b. A gas inlet 1 for introducing a gas as an ion source is provided in a center of the high frequency electrode 4a on the top of the cylindrical chamber 2. A magnet 5 is provided on the outside of the high frequency electrode 4b on the side of the cylindrical chamber 2 so as to aid effective generation of ions and adjust the shape of the plasma. A high frequency electric power of 13.56 MHz is applied to the high frequency electrodes 4a and 4b at 100 to 200 W and a pressure in the chamber 2 is maintained at $10^{-5}$ to $10^{-3}$ Torr. Thus a plasma is generated and the introduced gas is partially ionized in the cylindrical chamber 2.

The ion accelerator 9 comprises four meshy electrode plates 9a, 9b, 9c and 9d disposed parallel to each other. The first electrode plate 9a is provided at a bottom of the cylindrical chamber 2 as the plasma source. These four electrode plates 9a, 9b, 9c and 9d are insulated by an insulator 10 and kept with appropriate intervals therebetween. A first ion acceleration power supply 6 is connected between the first and the second electrode plates 9a and 9b. A voltage caused by the first ion acceleration power supply 6 derives the ions generated at the plasma source into the ion accelerator 9. A second ion acceleration power supply 7 is connected between the second and the third electrode plates 9b and 9c. A voltage caused by the second ion acceleration power supply 7 further accelerates the derived ions. The ions are accelerated and proceed vertically to the electrode plates 9a, 9b, 9c and 9d. A deceleration power supply 8 for controlling secondary electrons is connected between the third and the fourth electrode plates 9c and 9d.

A substrate 12 is mounted on the substrate holder 11 and the ions accelerated in the ion accelerator 9 irradiate the substrate 12. The distance between the fourth electrode plate 9d and the substrate 12 is about 50 cm. The ion implantation apparatus of the present invention is provided with a rotation mechanism for rotating the substrate holder 11 so as to implant the ions into the substrate uniformly. In the ion implantation apparatus with this structure, it is possible to implant ions uniformly into a substrate with a size up to 30 cm × 30 cm.

The electromagnetic ion energy analyzer 14 comprises apertures 15a and 15b with an aperture diameter of 100 μm, a pair of electrodes 16 with a size of 4 cm × 5 cm, respectively, for generating an electrical field, a pair of magnets 17 comprising a north pole and a south pole with a size of 4 cm × 5 cm, respectively, for generating a magnetic field and a detection area 18 for detecting the ions. The detection area 18 has a size of 20 cm × 20 cm and is disposed 10 cm away from the aperture 15b. One of the electrodes 16 has a terminal 19 for applying a voltage thereto. The electrodes 16 and the magnets 17 are provided in a manner that the electric field and the magnetic field are formed vertically to a direction in which the ions irradiate (hereinafter called the "ion incident direction"). (The ion incident direction is parallel to a z-axis in FIG. 2.) The distance between the pair of the electrodes 16 and the magnets 17 is adjusted so as to generate an electric field of 100 kV/m between the electrodes 16 and a magnetic field of 300 gauss between the magnets 17. The ions having passed through the apertures 15a and 15b further pass through the electric field and the magnetic field generated by the electrodes 16 and the magnets 17, respectively, to reach the detection area 18.

The charge collector 13 is provided in a position irradiated by the ions the amount of which is practically equal to that of the ions irradiating through the apertures 15a and 15b of the electromagnetic ion energy analyzer 14 per unit time. The charge collector 13, which is called a Faraday cup as well, measures a charge of the irradiating ions as a current density.

Figure 2:
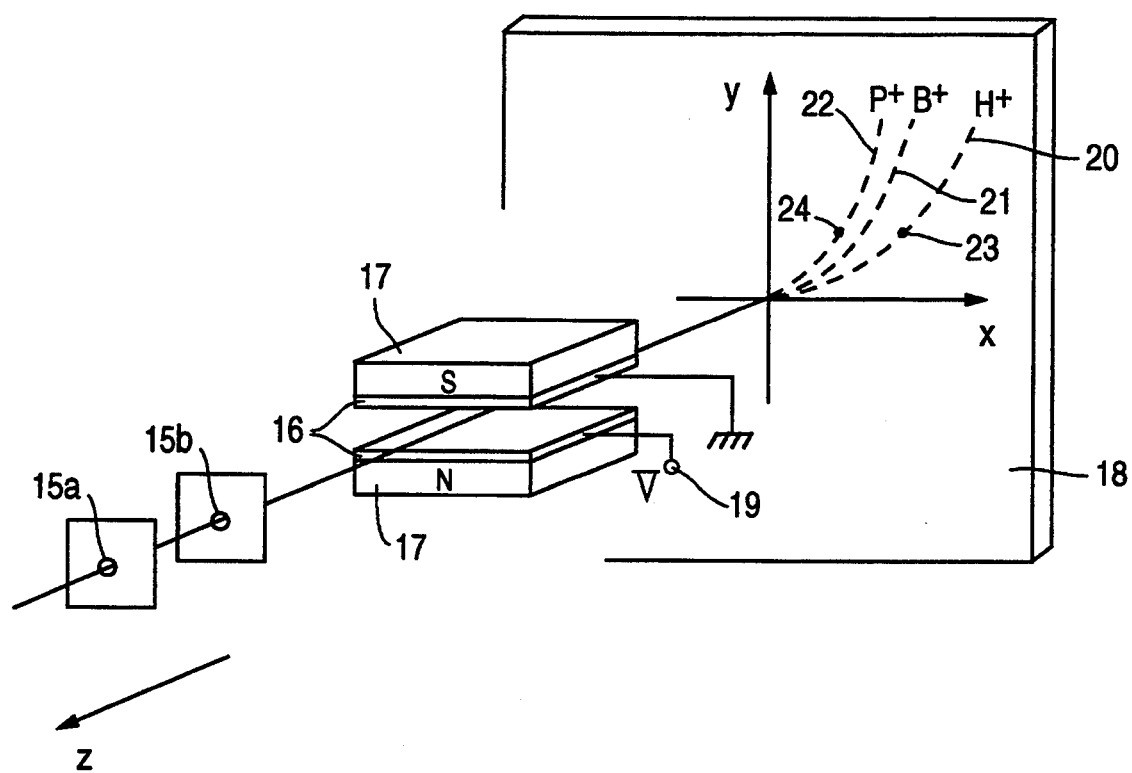
FIG. 2 is a diagram for showing an operation of a means for measuring a number of ions used in the ion implantation apparatus according to the present invention.

FIG. 2 schematically shows a principle of the measurement by the electromagnetic ion energy analyzer 14, which will now be described by illustrating an example in which $H^+$, $B^+$ and $P^+$ enter the electromagnetic ion energy analyzer 14.

Broken lines 20, 21 and 22 show points on a surface of the detection area 18 at which each kind of ions arrives. When an energy for the implantation is determined, one point on the surface of the detection area 18 is settled per each kind of ion species as an impinge position. On a coordinate having the ion incident direction through the apertures 15a and 15b as the z-axis and the detection area 18 as the x-y plane, the impinge positions are represented by a parabola which satisfies the following formula:

$$y = k(M/Z)x^2$$

wherein M is a mass of an ion, Z is a number of a valence of the ion and k is a constant determined by a design of the electromagnetic ion energy analyzer 14. As is evident from the formula, each kind of the ion arrives at a different position on the detection area 18 by a force applied from the electric and magnetic fields depending upon the mass and the charge of the ions.

When $PH_3$ diluted with $H_2$ is used as an introduced gas, $H^+$ and $P^+$ are generated at the plasma source. When the generated $H^+$ and $P^+$ are accelerated at a voltage of 100 kV, $H^+$ and $P^+$ reach only points 23 and 24, respectively. The distance between the points 23 and 24 on the detection area 18 is about 3 cm. A charge collector other than the charge collector 13 is provided on such a determined position as a means for detecting a desired kind of ions, thereby measuring the current density caused by the desired kind of ions. In this example, since only $P^+$ is necessary to the ion implantation, the current density of $P^+$ alone can be measured when a charge collector is provided on the point 24. In this way, the dose of the ions necessary to the ion implantation can be measured. Moreover, when a total current density of $H^+$ and $P^+$ is measured at the same time by the charge collector 13, a ratio of $P^+$ necessary to the ion implantation to all the kinds of the ions, $H^+$ and $P^+$ can be obtained. The dose of $P^+$ can be controlled when an ion irradiation time is determined by using the obtained ratio.

When the ions are implanted with a different energy, the charge collector is moved along the aforementioned mentioned parabola depending upon the energy to measure a current density of the desired kind of ions. The charge collector is automatically moved along the x- and y-axes depending upon the charge and the mass of the ion to be detected and the acceleration energy of the ion, therefore such a series of operations can be conducted automatically and easily to control the amount of the ion necessary to the ion implantation.

In the above-mentioned example, the electric field and the magnetic field are generated vertically to the ion incident direction. However, the ions can be separated depending upon the kind thereof and an energy for the ion implantation as far as the electric field and the magnetic field generated by the electrodes 16 and the magnets 17, respectively, are not parallel to the ion incident direction, since such electric and magnetic fields have components vertical to the ion incident direction. Moreover, in the above-mentioned example, the acceleration and the proceeding of the ions are in the same direction. However, in other structures, the ions can be accelerated in different directions from the proceeding direction thereof. Even in such a case, the ions can be separated depending upon the mass and the charge thereof and the implantation energy by generating the electric and magnetic fields having components vertical to the incident direction of the ions entering the electromagnetic ion energy analyzer 14.

In the present example, the total current density of H+ and P+ is measured by the charge collector 13, and the current density of P+ is measured by the electromagnetic ion energy analyzer 14. Thus, the ratio of P+ to all the kinds of the ions is obtained. However, the ion irradiation time can be determined only with the electromagnetic ion energy analyzer 14.

Moreover, in the example, the number of the ions having reached the detection area 18 is measured by the charge collector, but it can be measured by using a film. When a film is provided on the detection area 18, the ions arrive at different positions on the film depending upon the mass and the charge thereof. By measuring a density of the trace of the ions on each impinge position, the ratio of each kind of the ions can be obtained. The dose of the ions necessary to the ion implantation can be controlled by using the obtained ratio.

With a simple structure as is shown in the above described example, the ions can be implanted into a large substrate, and a dose of the ions to be implanted can be easily controlled.

In this way, ions can be implanted into a large substrate, controlling the dose thereof accurately, according to the present invention. As a result, a semiconductor device with uniform characteristics can be fabricated with an increased yield.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An ion implantation apparatus comprising:
   a plasma source for generating ions;
   an ion accelerator for accelerating the ions;
   a substrate holder provided on a position which the accelerated ions irradiate; and
   an energy analyzing means, disposed adjacently to the substrate holder so that some of the accelerated ions enter the energy analyzing means, for separating a desired kind of ions from the entering ions and measuring a number of the desired kind of the ions.

2. An ion implantation apparatus according to claim 1, wherein the energy analyzing means generates an electric field and a magnetic field having components vertical to an incident direction of the ions entering the energy analyzing means, and the entering ions pass through the electric field and the magnetic field.

3. An ion implantation apparatus according to claim 2, wherein the energy analyzing means measures a current density of the desired kind of ions.

4. An ion implantation apparatus according to claim 2, wherein the energy analyzing means has a film for detecting traces of the desired kind of ions.

5. An ion implantation apparatus comprising:
   a plasma source for generating ions;
   an ion accelerator for accelerating the ions;
   a substrate holder provided on a position which the accelerated ions irradiate;
   an electromagnetic ion energy analyzer, disposed adjacently to the substrate holder so that some of the accelerated ions enter the electromagnetic ion energy analyzer, for separating a desired kind of ions from the entering ions and measuring a number of the desired kind of ions, and
   a charge collector for measuring a number of the ions the amount of which is practically equal to that of the ions entering the electromagnetic ion energy analyzer per unit time,
   the electromagnetic ion energy analyzer generating an electric field and a magnetic field having components vertical to an incident direction of the ions entering the electromagnetic ion energy analyzer, and having a detection area including different points at which the ions having passed through the electric field and the magnetic field arrive depending upon a mass and a charge of the ions.

* * * * *